United States Patent
Furukawa et al.

(10) Patent No.: US 8,147,903 B2
(45) Date of Patent: Apr. 3, 2012

(54) CIRCUIT PATTERN FORMING METHOD, CIRCUIT PATTERN FORMING DEVICE AND PRINTED CIRCUIT BOARD

(75) Inventors: Masao Furukawa, Yokohama (JP); Yuji Tsuruoka, Kawasaki (JP); Takashi Mori, Tokyo (JP); Nobuhito Yamaguchi, Tokyo (JP); Seiichi Kamiya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1165 days.

(21) Appl. No.: 11/455,865

(22) Filed: Jun. 20, 2006

(65) Prior Publication Data
US 2006/0292496 A1 Dec. 28, 2006

(30) Foreign Application Priority Data
Jun. 22, 2005 (JP) .................................. 2005-181626

(51) Int. Cl.
*G03F 7/00* (2006.01)
(52) U.S. Cl. ...................... 427/96.1; 427/97.1; 428/901
(58) Field of Classification Search .................. 428/901; 427/96.1, 97.1
See application file for complete search history.

(56) References Cited

U.S. PATENT DOCUMENTS
| | | | |
|---|---|---|---|
| 5,833,914 A | 11/1998 | Kawaguchi | |
| 6,126,262 A * | 10/2000 | Misumi | 347/15 |
| 6,177,714 B1 | 1/2001 | Nagai | |
| 6,503,831 B2 | 1/2003 | Speakman | |
| 6,868,885 B2 | 3/2005 | Kakimoto et al. | 156/379 |
| 2003/0159783 A1 | 8/2003 | Kakimoto et al. | 156/379 |
| 2004/0000429 A1 | 1/2004 | Furusawa et al. | 174/264 |
| 2006/0288932 A1 | 12/2006 | Mori et al. | 118/313 |
| 2006/0290736 A1 | 12/2006 | Mori et al. | 347/19 |
| 2006/0292496 A1 | 12/2006 | Furukawa et al. | 430/311 |

FOREIGN PATENT DOCUMENTS
| | | |
|---|---|---|
| EP | 1 074 355 A2 | 2/2001 |
| JP | 11-163499 * | 6/1999 |
| JP | 11-274671 | 10/1999 |
| JP | 2003-309369 | 10/2003 |
| JP | 2003-318133 | 11/2003 |
| JP | 2003-324266 | 11/2003 |
| JP | 2005-340437 | 12/2005 |
| JP | 2006-100400 | 4/2006 |

OTHER PUBLICATIONS

Extended European Search Report (including European search opinion) dated Apr. 28, 2008, mailed in a Communication dated May 8, 2008, in copending European patent application No. 06 01 2739.
Japanese Office Action dated Jun. 24, 2008, issued in corresponding Japanese patent application No. 2006-166455, with English translation.
Taiwan Office Action issued Apr. 22, 2010, in corresponding Taiwan application No. 95122502, with an English translation.

* cited by examiner

*Primary Examiner* — Timothy Meeks
*Assistant Examiner* — Tabassom Tadayyon Eslami
(74) *Attorney, Agent, or Firm* — Fitzpatrick, Cella, Harper & Scinto

(57) ABSTRACT

A circuit pattern forming method that can reduce a possibility of undesired short-circuits being produced in the circuit by satellites formed when fabricating a conductive pattern. Thereby, a highly reliable printed circuit board can be formed. A conductive pattern and an insulating pattern of a predetermined thickness are overlappingly drawn by scanning a liquid ejection head and a substrate relative to each other a plurality of times, while ejecting droplets of a conductive pattern forming solution and an insulating pattern forming solution. When forming the conductive pattern and the insulating pattern that adjoin each other on the substrate, the step of forming the insulating pattern of at least one scan is executed between the conductive pattern forming steps that are executed the plurality of times, until the conductive pattern has a predetermined thickness.

3 Claims, 13 Drawing Sheets

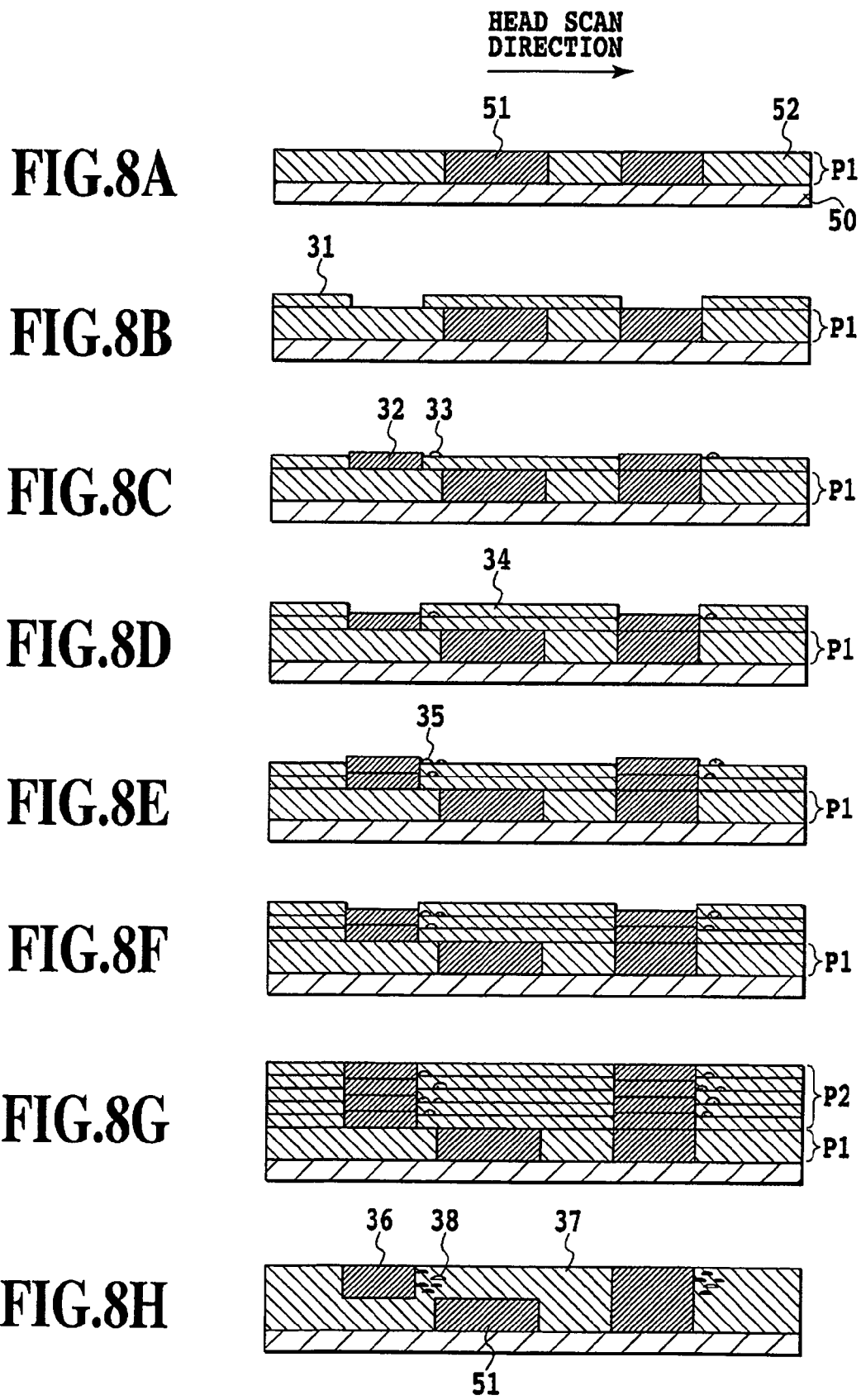

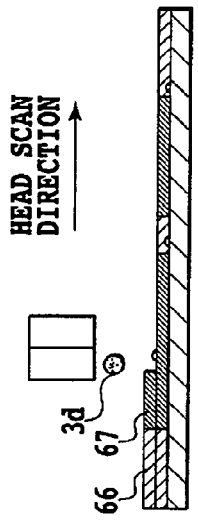
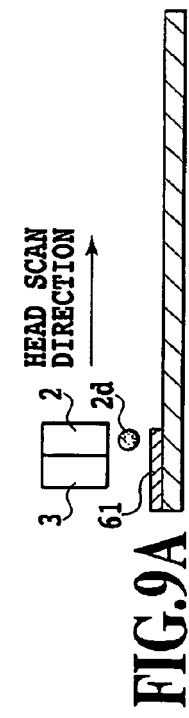
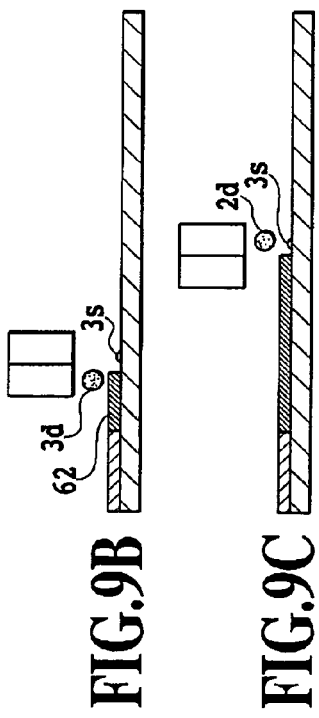
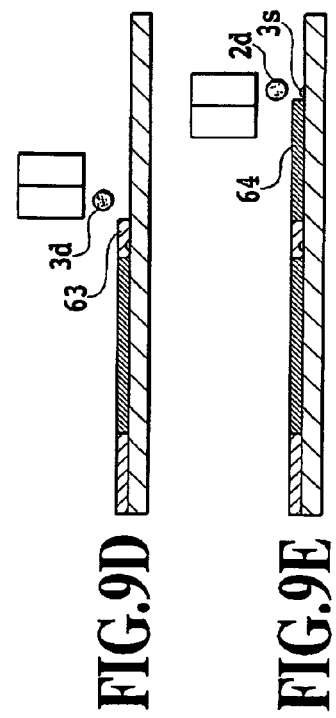
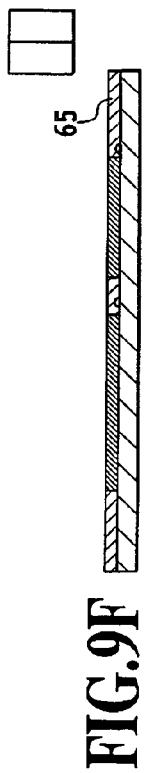

HEAD SCAN
DIRECTION
→

CIRCUIT PATTERN FORMING METHOD, CIRCUIT PATTERN FORMING DEVICE AND PRINTED CIRCUIT BOARD

This application claims priority from Japanese Patent Application No. 2005-181626, filed Jun. 22, 2005, which is hereby incorporated by reference herein.

BACKGROUND OF THE INVENTION

1. Field of the Invention

The present invention relates to a circuit pattern forming method and a circuit pattern forming device that are used to form circuit patterns by ejecting a conductive pattern forming solution and an insulating pattern forming solution onto a substrate.

2. Description of the Related Art

In forming patterns on printed circuit boards, a subtractive method has been in general use. The subtractive method, however, requires a large number of fabrication processes and its cost occupies a large percentage of an overall manufacturing cost. To deal with this problem, a so-called liquid ejection method, which requires a smaller number of steps and is suited for small-lot production of a wide variety of products, has been proposed in recent years. This liquid ejection method draws a pattern on a substrate by ejecting a pattern forming solution onto the substrate, and is disclosed in U.S. Patent Application Publication No. 2004/0000429 (corresponding to Japanese Patent Application Laid-open No. 2003-309369).

The '429 publication discloses a method of forming wiring patterns by moving a substrate and a liquid ejection head relative to each other, and causing the head to eject liquid droplets as the substrate and the head are moved. An overview of this pattern forming method will be explained by referring to FIG. 10A to FIG. 10K.

FIGS. 10A to 10K are cross-sectional views of a multilayered printed circuit board during the manufacturing process. FIG. 10A shows a drop of a conductive pattern forming solution, containing fine metal particles, being ejected from a liquid ejection head 101 onto a substrate 102. Here, designated by reference numeral 104, are dots formed by the ejected droplets 103 landing on the substrate 102. Landing intervals of the dots 104 are such that they do not contact each other. After the conductive pattern is formed, a solvent of the conductive pattern forming solution is dried, to a state shown at 105 of FIG. 10B. The dots 105 that are formed after the solvent is evaporated are thinner than before they were dried.

Next, as shown in FIG. 10C, dots 106 are formed between adjoining dots 105, by ejecting droplets of the conductive pattern forming solution onto positions between the previously formed dots. Then, they are dried by evaporating the solvent to form a pattern 107, with all its dots connected, as shown in FIG. 10D. Further, to form the conductive pattern to a desired thickness, the above ejection and drying steps are repeated to form first layer conductive pattern 108, as shown in FIG. 10E.

Next, on the already formed conductive patterns, the conductive pattern forming solution is ejected, to form an interlay conduction post 109, for electrically connecting the first and second layers (see FIG. 10F). Then, the patterns are heated to have metal particles in the interlayer conduction post 109 electrically contact one another, making the pattern 108 and the interlayer conduction post 109 an integral pattern (see FIG. 10G).

Then, as shown in FIG. 10H, a solution 110 to form an interlayer insulation film is applied to a thickness such that the interlayer conduction post 109 slightly protrudes from the insulation film. Then, the patterns are heated, to remove the solvent and to harden the insulating material, with the result that the thickness of the interlayer insulation film 110 is reduced to half, as shown in FIG. 10I. Here, the insulation pattern forming solution is applied again (FIG. 10J), and subjected to a heating step to form an almost flat insulation film, as shown in FIG. 10K.

In forming a second layer, the above pattern forming procedure is repetitively performed over the first layer of FIG. 10K, to form a multilayered circuit.

As described above, with the liquid ejection type circuit forming method that uses the liquid ejection head, the number of steps required is relatively small, and thus, the printed circuit board can be constructed inexpensively. However, when ejecting liquid droplets from nozzles of the liquid ejection head, small droplets, called satellites, are also sprayed with the main droplets, causing problems to the circuits being formed.

The above problem will be explained in detail, as well as a droplet ejection process of the head, and how the satellites are formed along with the main droplets.

FIGS. 11A to 11F are cross-sectional views showing how a circuit forming liquid (referred to simply as a liquid), such as a conductive pattern forming solution and an insulation pattern forming solution, is ejected from the liquid ejection head. In each figure, portions shown shaded represent the solution. As shown in FIG. 11A, the circuit forming solution is filled from a liquid chamber 121 through a liquid path 122 up to an opening of a nozzle 123. Denoted by 124 is a heater, which is formed in a silicon substrate 125. The solution present in the liquid chamber 121 advances into the liquid path 122 by a capillary attraction. At the same time, the solution in the liquid path 122 is acted upon by a negative pressure generated by a supply unit, such as a liquid tank, and tends to be drawn back into the liquid chamber 121. Therefore, when no solution ejection is performed, these two forces balance holding the solution, as shown. At this time, the solution in the nozzle 123 forms a concave meniscus 126, as shown by the negative pressure acting toward the liquid member 121.

FIGS. 11B to 11F show how a bubble is formed, a droplet is ejected and a meniscus is formed, as the actual ejection operation is performed, as opposed to the static state shown in FIG. 11A.

When a printing operation is started and a voltage is applied to the heater 124, thermal energy is generated by the heater 124, to heat the solution in the liquid path 122, producing a bubble 127, as a result of film boiling. The bubble 127 continues to expand, while the heater 124 is energized, and the expansion force displaces the solution in the liquid path 122. That is, the solution near the nozzle 123 breaks the meniscus 162 and protrudes out, and the solution present near the liquid chamber 121 moves toward the liquid chamber 121, as shown in FIG. 11B.

Further, when the voltage application to the heater 124 is stopped, with the solution greatly protruding from the nozzle 123, as shown in FIG. 11B, the bubble 127 contracts, withdrawing the solution near the nozzle 123 greatly into the liquid path 122. At this time, the solution that was protruding outside parts from the solution being withdrawn into the liquid path 122 and, as shown in FIG. 11C, flies in a direction of the arrow. The solution that was sent flying includes a main droplet 128 followed by smaller droplets, called satellites 129, both of which land on the substrate.

The meniscus 126, withdrawn into the liquid path 122 by the capillary attraction after the bubble has vanished, now moves toward the nozzle 123 again, filling the solution into the liquid path 122 (see FIG. 11D). During this refilling process, the solution meniscus changes its state from the one shown in FIG. 11C to the one shown in FIG. 11D, and further moves to an initial state near the nozzle. Because of inertia, the meniscus cannot stop at the initial state, but slightly bulges out from the nozzle 123 (FIG. 11E).

With the meniscus slightly bulging, the surface tension of the solution and the negative pressure in the tank combine to pull the meniscus into the nozzle 123. This oscillates the solution and the oscillation progressively attenuates until it finally stops (FIG. 11F).

One printing operation ejects one main droplet 128 from a nozzle, followed by one or more satellites 129. It is known that the size of the satellites 129 and their distances from the main droplet 128 vary from one nozzle 123 to another, and that the ejection performance also changes from one operation to another, even in one and the same nozzle.

In the circuit pattern forming method described above, there is a possibility that these satellites may cause problems to the circuit operation. How the satellites are formed will be explained in detail by referring to FIGS. 12A to 12C.

First, a relation between the landing positions of the main droplet and satellites ejected from a nozzle of the head during scanning will be explained, by referring to FIGS. 12A-12C. FIG. 12A and FIG. 12B illustrate the process of drawing a pattern by moving the ejection head and the substrate relative to each other as the head ejects droplets. FIG. 12C shows shapes of droplets formed on the substrate in one ejection operation. The relative movement (scan) is done by holding the substrate 132 immovable, and moving the head 131 from the left toward the right in the figure.

When a droplet 134 is ejected from the nozzle 133 of the head 131, since the head 131 is moving toward the right, the droplet 134 flies down diagonally toward the right, from the ejected position, as shown in FIG. 12A. Then, as shown in FIG. 12B, the main droplet 134 is accompanied by one or more satellites 135 as it is ejected. This satellite 135, too, falls down diagonally toward the right. The satellite 135, since it is formed following the main droplet 134, lands at a position slightly shifted to the right (in the scan direction) from the main droplet 134. Conversely, when the scan is executed in the opposite direction, i.e., toward the left, the satellite 135 lands at a position to the left of the main droplet 134 (not shown). A distance D between the main droplet 134 and the satellite 135 varies, depending on a head scan speed, a droplet ejection speed, a droplet volume, components of a droplet, and a distance from the nozzle to the substrate.

Next, the process of drawing a pattern by continuously ejecting droplets will be described. FIG. 13A to FIG. 13C show the pattern drawing process, FIGS. 13A and 13B being cross-sectional views, and FIG. 13C, a plan view. It is assumed that the ejection head scans from the left to the right.

FIG. 13A shows a pattern 140 drawn on the substrate 132, with a satellite 141 accompanying the ejected droplets shown to have landed near the pattern 140. FIG. 13B shows the pattern thickened by applying droplets to the same positions again. Although a satellite 142 is also formed at this time, since the distance between the landing positions of the main droplet and the satellite often varies from one ejection operation to another, as described above, the satellite 142 that has landed in the subsequent scan often does not land on the preceding satellite 141. When the droplet application is repeated until the pattern reaches a desired thickness, there are cases in which satellites may contact one another, as shown enclosed by a one-dot line in the plan view of FIG. 13C, depending on the landing state of the satellites. In these cases, two patterns may get connected or short-circuited, resulting in an abnormal circuit operation.

SUMMARY OF THE INVENTION

The present invention has been accomplished to overcome the problems experienced with the conventional technology. It is an object of this invention to provide a circuit forming method, which can reduce a possibility of undesired short-circuits being produced in the circuit by satellites formed when fabricating a conductive pattern, and thereby, can form a highly reliable printed circuit board.

To achieve the above objective, the present invention has the following construction. According to a first aspect, the present invention provides a method of forming a circuit pattern having a conductive pattern and an insulating pattern of a predetermined thickness, comprising steps of performing, a plurality of times, the step of forming a conductive pattern of one scan while scanning a first head and a substrate relative to each other, the first head ejecting onto the substrate a first solution for forming the conductive pattern, until the conductive pattern formed on the substrate has a predetermined thickness, and performing, a plurality of times, the step of forming an insulating pattern of one scan while scanning a second head and the substrate relative to each other, the second head ejecting onto the substrate a second solution for forming the insulating pattern, until the insulating pattern formed on the substrate has a predetermined thickness, wherein, when forming the conductive pattern and the insulating pattern that adjoin each other on the substrate, the step of forming the insulating pattern of at least one scan is executed, while the conductive pattern forming steps are executed a plurality of times.

According to a second aspect, this invention provides a printed circuit board comprising a conductive pattern formed by a first solution ejected onto a substrate with a predetermined thickness, while scanning a first head and the substrate relative to each other, the first head repeatedly ejecting a first solution onto the substrate, and an insulating pattern for at least one scan, the insulating pattern being formed by a second solution ejected onto a substrate while scanning a second head and the substrate relative to each other, the second head ejecting a second solution onto the substrate.

According to a third aspect, this invention provides a device to form a circuit pattern having a conductive pattern and an insulating pattern of a predetermined thickness, the device comprising a first head to eject a first solution to form the conductive pattern, means for performing control to execute an operation of forming the conductive pattern of one scan a plurality of times until the conductive pattern on a substrate has a predetermined thickness, the operation of forming the conductive pattern of one scan being performed by scanning the first head and the substrate relative to each other, while causing the first head to eject the first solution onto the substrate, a second head to eject a second solution to form the insulating pattern, and means for performing control to execute an operation of forming the insulating pattern of one scan a plurality of times, until the insulating pattern on the substrate has a predetermined thickness, the operation of forming the insulating pattern of one scan being performed by scanning the second head and the substrate relative to each other, while causing the second head to eject the second solution onto the substrate, wherein, when forming the conductive pattern and the insulating pattern that adjoin each other on the substrate, the operation of forming the insulating pattern of at least one scan is executed between the conductive pattern forming operations that are executed the plurality of times, until the conductive pattern has a predetermined thickness.

With this invention, when forming a circuit pattern by ejecting the conductive pattern forming solution and the insulating pattern forming solution onto the substrate, satellites, which are formed accompanying the ejections of the conductive pattern forming solution and land on the insulating pattern, are covered with the insulating pattern forming solution. It is, therefore, possible to greatly reduce a change of undesired short-circuits being formed in the conductive pattern. This, in turn, allows highly reliable circuits to be formed, improving a yield in fabricating printed circuit boards.

The above and other objects, effects, features and advantages of the present invention will become more apparent from the following description of embodiments thereof, taken in conjunction with the accompanying drawings.

BRIEF DESCRIPTION OF THE DRAWINGS

FIGS. 8A to 8H are schematic diagrams showing a process of drawing conductive and insulating patterns on a substrate in the third embodiment of this invention;

FIGS. 9A to 9K are schematic diagrams showing a process of drawing conductive and insulating patterns on a substrate in a fourth embodiment of this invention;

DETAILED DESCRIPTION OF PREFERRED EMBODIMENTS

Now, embodiments of this invention will be described in the following order.

1. A description of an outline construction of the circuit pattern forming device and a description of a control system for the device.

2. A description of a material used in the circuit pattern fabrication.

3. A description of the circuit pattern forming method.

[1. Outline Construction of the Circuit Pattern Forming Device and the Construction of the Control System]

First, as one embodiment of this invention, let us explain an outline construction of the circuit pattern forming device used to form a circuit pattern made up of an insulating pattern and a conductive pattern formed on a substrate.

Figure 1:
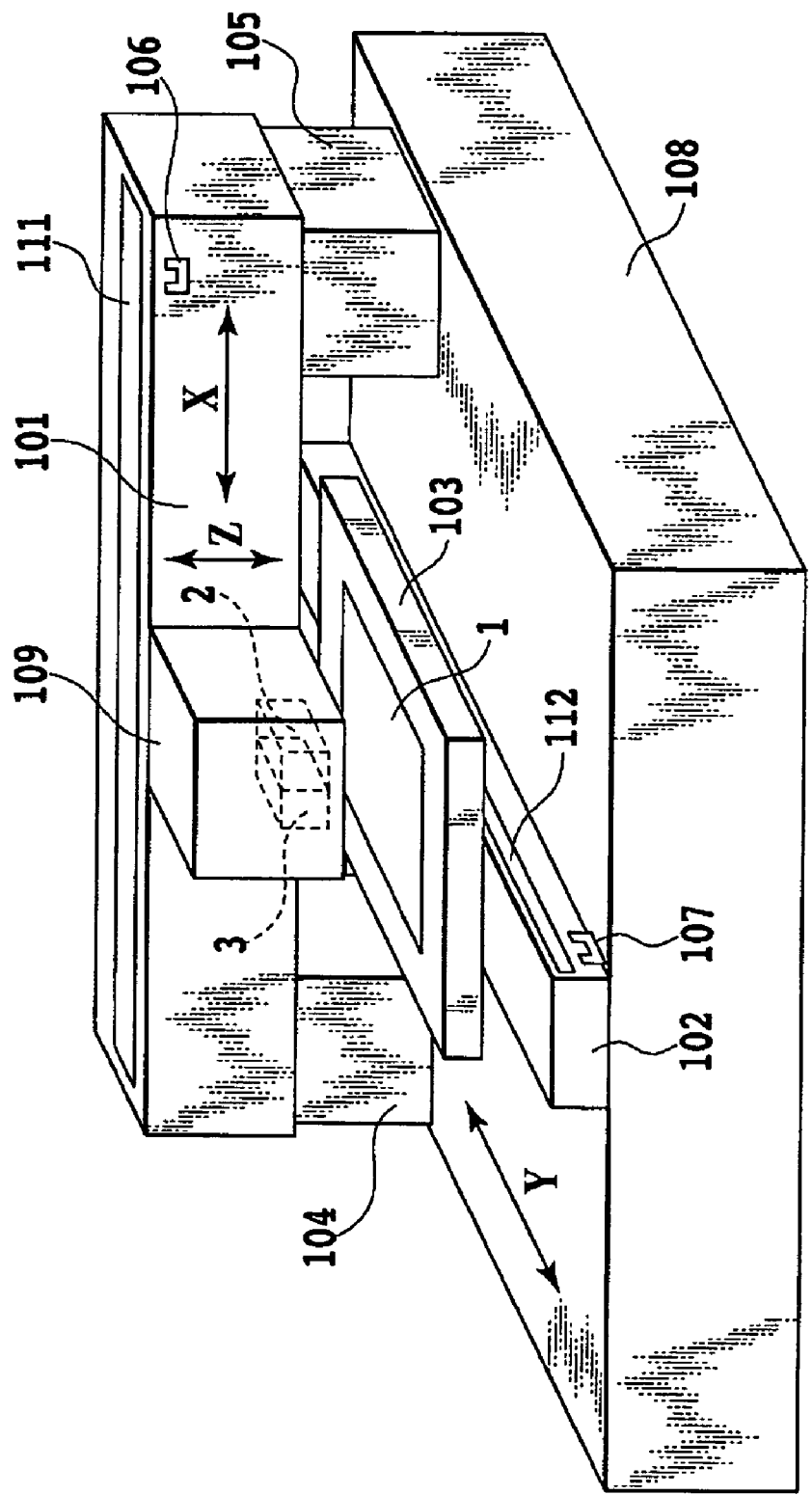
FIG. 1 is a perspective view schematically showing an outline construction of a circuit pattern forming device of one embodiment.

FIG. 1 is a perspective view schematically showing an outline construction of the circuit pattern forming device in this embodiment.

The circuit pattern forming device shown here has a carriage 109 that reciprocally travels in the scan direction (X direction) and a stage 103 on which a substrate 1, to be formed with a circuit pattern, is mounted. In this carriage, a liquid ejection head 2 for ejecting an insulation pattern forming solution onto the substrate 1 and a liquid ejection head 3 for ejecting a conductive pattern forming solution are arranged side by side in the X direction. Also mounted on the carriage are two tanks (not shown) that supply the insulation pattern forming solution to the liquid ejection heads 2, 3, respectively. Each liquid ejection head has arranged, in a direction crossing the scan direction (X direction), a large number of nozzles to eject the liquid supplied from the associated tank. These nozzles form a nozzle array. This nozzle arrays should preferably extend in a Y direction perpendicular to the scan direction. Each head may have two or more nozzle arrays. The liquid ejection heads 2, 3 are repetitively scanned over the substrate, while ejecting the conductive pattern solution and the insulating pattern solution onto the substrate to form a circuit pattern.

While, in the above description, the liquid ejection head is moved over the substrate, the effect of this invention can also be produced by holding the head stationary and moving the substrate.

A carriage (CR) linear motor 101 is provided as a power source to cause the carriage 109 to execute forward and backward scans. As a means for moving the substrate 1 in the Y direction, the stage 103 and a line and feed (LF) linear motor 102, which drives the stage, are provided. The LF linear motor 102 is rigidly secured to a bed 108, so that the upper surface of the stage 103 carrying the substrate 1 can be kept parallel to the upper surface of the bed 108 at all times, if the stage 103 is moved. The CR linear motor 101 is secured to highly rigid bases 104, 105 erected on the bed 108.

The carriage 109 reciprocally moves in the main scan direction (X direction) along an upper surface of the bed, i.e., a stage surface. The CR linear motor 101 and the LF linear motor 102 each incorporate a linear encoder 111, 112 and an origin sensor 106, 107. The outputs of the linear encoder 111, 112 and the origin sensor 106, 107 are used as a servo control input for driving the linear motors. Further, the linear encoder 111 on the carriage side is used to generate a solution ejection timing. The encoder has a resolution of 0.5 μm, high enough to form circuit patterns several tens of μm wide.

Though not shown here, the circuit pattern forming device has a raise/lower mechanism that finely moves the carriage up or down in a direction (Z direction) perpendicular to the upper surface of the stage 103. This raise/lower mechanism can adjust a gap between the carriage and the upper surface of the substrate or the circuit pattern formed on the substrate.

Further, the circuit pattern forming device of this embodiment is connected with a personal computer (not shown) as a host device. Based on figure information (circuit pattern forming information) sent from this personal computer, the circuit pattern forming device moves the stage 103 to a predetermined position by the LF linear motor 102 and scans the carriage 109 by the CR linear motor 101, while ejecting the conductive pattern forming solution or insulating pattern forming solution from the head onto a predetermined position on the substrate to form a conductive pattern or an insulating pattern. At this time, if the nozzle array length as measured in the Y direction is shorter than the length of the substrate 1 as measured in the Y direction, when the drawing operation of the head in the first scan is completed, the substrate 1 is moved a nozzle array length in the Y direction by the LF linear motor 102, and the head is again scanned to perform drawing. By repeating this scan (drawing) of the liquid ejection head and the feeding substrate 1, one layer of a predetermined conductive pattern or an insulating pattern can be formed in the entire circuit pattern forming area of the substrate 1. Of course, if the length of the circuit pattern forming area is shorter than the head, one layer of a circuit pattern can be completely drawn by the first scan of the liquid ejection head. Then, the pattern forming operation is repeated on the entire circuit pattern forming area, forming the conductive pattern or insulating pattern of a predetermined thickness. Details of the drawing operation to obtain a desired thickness of pattern will be described later in the discussion of: [3. Description of A Pattern Forming Method].

To form a circuit pattern on the substrate by the circuit pattern forming device and to complete a printed circuit board, a fixing process is required, which evaporates the solvent in the solutions drawn on the substrate 1 to fix the circuit pattern on the substrate. Thus, a drying device is necessary, in addition to the circuit pattern forming device.

Next, a control system of the circuit pattern forming device of this embodiment will be explained.

Figure 2:
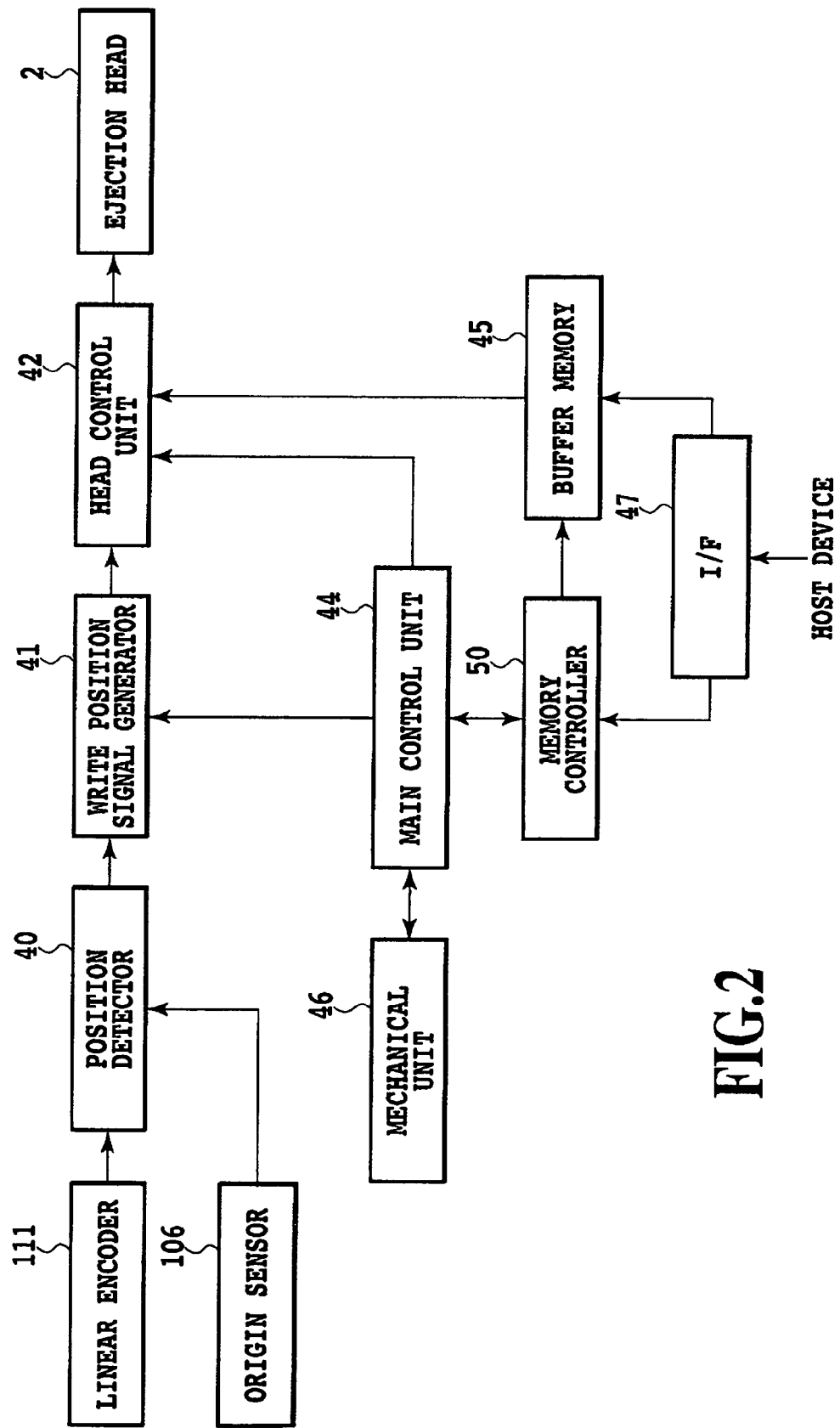
FIG. 2 is a block diagram schematically showing a control system in the circuit pattern forming device of this embodiment.

FIG. 2 is a block diagram schematically showing an overall configuration of a control system in the circuit pattern forming device of this embodiment. A mechanical unit 46 includes the CR linear motor 101 for moving, in the main scan direction, the carriage 109 carrying the liquid ejection heads 2, 3, and also, the LF linear motor 102 for transporting the stage 103 carrying the substrate 1.

A main control unit 44 is a central part of the control system that controls the entire circuit pattern forming device of this embodiment, including the liquid ejection head and the mechanical unit 46. The main control unit 44 has a CPU, a ROM, in which operation programs are stored, and a work RAM that allows reading and writing of a variety of data.

The main control unit 44 outputs a control signal to the mechanical unit 46, to perform a mechanical control, for example, on the movement of the carriage 109 and stage 103. It also transfers signals to and from a head control unit 42, a memory control unit 50 and a drawing position signal generation unit 41, to control the operation of the liquid ejection head 2. An I/F unit 47 is an interface between the personal computer (not shown) and the circuit pattern forming device. The I/F unit 47 receives a command and circuit pattern drawing data (circuit pattern forming data) from a host device, such as the personal computer. The memory control unit 50 transfers the command from the I/F unit 47 to the main control unit 44 and, under the control of the main control unit 44, generates an address signal and a draw timing, to put the circuit pattern drawing data into a buffer memory 45.

Further, the main control unit 44 analyzes the command received from the I/F unit 47 and, according to the result of the analysis, sets drawing conditions, such as a drawing speed and a drawing resolution. Then, based on the drawing conditions, the main control unit 44 controls the mechanical unit 46 and the drawing position signal generation unit 41, to execute the drawing operation under the predetermined conditions.

Further, the circuit pattern drawing data received from the personal computer (not shown) is stored in the buffer memory 45 or a temporary memory, and then transferred to the head control unit 42 by the control of the memory control unit 40 that has received the command from the main control unit 44.

In synchronism with the drawing position signal output from the drawing position signal generation unit 41, the head control unit 42 drives individual nozzles of the liquid ejection head, to draw a circuit pattern according to the circuit pattern drawing data transferred from the buffer memory 45.

[2. Description of the Circuit Pattern Forming Solution]

(2-1. Substrate)

The substrate 1 used in this embodiment basically is shaped like a film, a sheet or a plate, with a planar surface. When forming a circuit pattern layer, the pattern fixing is facilitated by evaporating the solvent. Therefore, it is particularly preferable that the substrate have good heat resistance. Other than the planar image, the substrate may have a curved shape, as long as a circuit pattern can be formed by the liquid ejection method. The substrate may use the following materials: thermoplastic resin films, such as polyester film, aromatic polyamide film and polyamide film, cloths and nonwoven fabric of glass fibers, polyester fibers and aromatic polyamide fibers impregnated with thermoplastic resin and epoxy resin and then, hardened and shaped like a sheet, and a glass epoxy laminated plate used for ordinary printed circuit boards.

[2-2. Pattern Forming Solution]

For conductivity, the conductive pattern forming solution generally includes metal particles, such as Al, Ag and $SnO_2$. The metal particles preferably have diameters in a range of several tens to several hundreds of nm, in terms of uniformity and stability of circuit patterns. The solution includes water and a water-soluble organic solvent and other components, such as a viscosity adjusting agent, a pH adjusting agent, an antiseptic, a surfactant, and an antioxidant, as necessary.

The insulating pattern forming solution preferably includes insulating particles of silica, alumina, calcium carbonate and magnesium carbonate. Other materials can also be used, if they exhibit an insulating capability. A liquid medium includes water. It is also possible to mix a water-soluble organic solvent and other additives, such as a viscosity adjusting agent, a pH adjusting agent, an antiseptic, various kinds of surfactant, an antioxidant, and an evaporation accelerator, as necessary.

After a circuit pattern has been drawn with the solution, it is dried, to evaporate the solvent. Further, all the patterns after being drawn and dried are sintered, to form a highly conductive printed circuit board with metal particles forming metal connections.

[3. Description of a Circuit Pattern Forming Method]

First Embodiment

Figure 3:
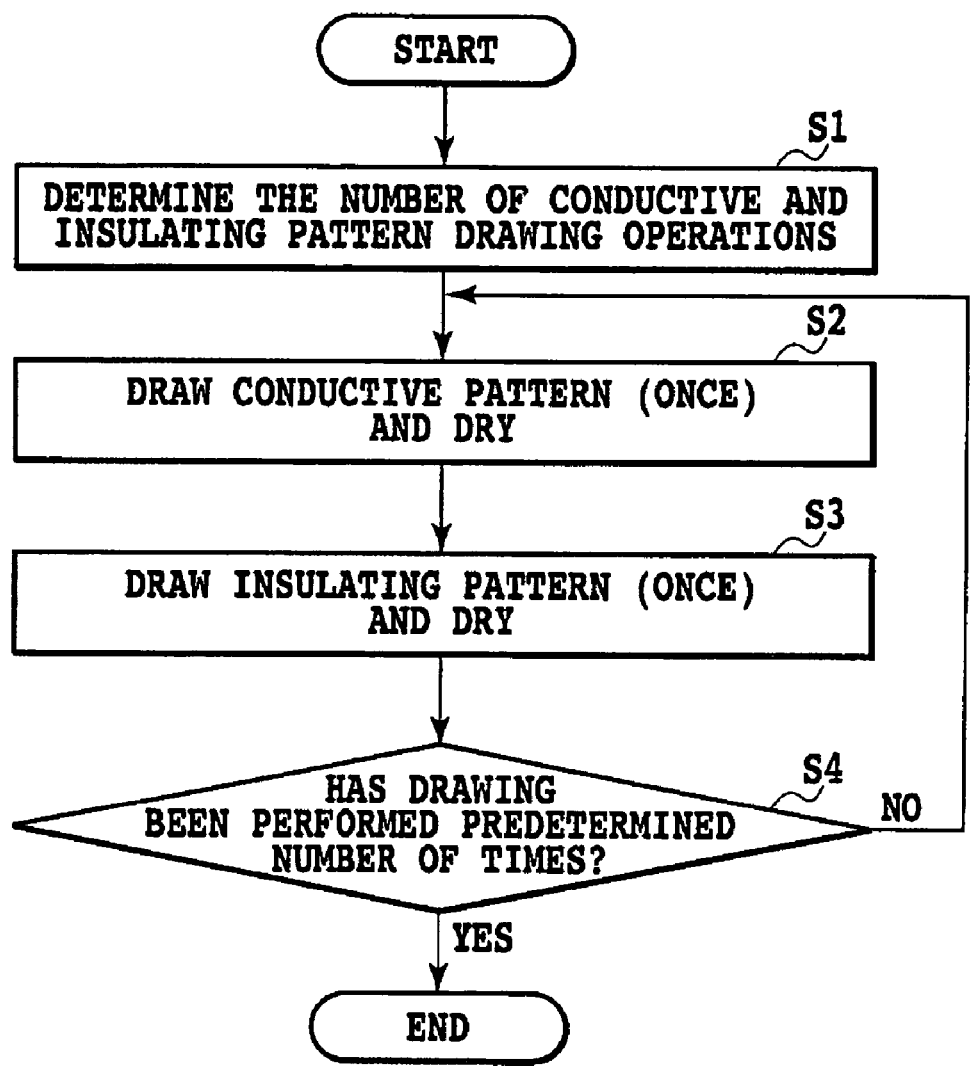
FIG. 3 is a flow chart showing a drawing procedure in the pattern forming method in a first embodiment of this invention.
Figure 4:
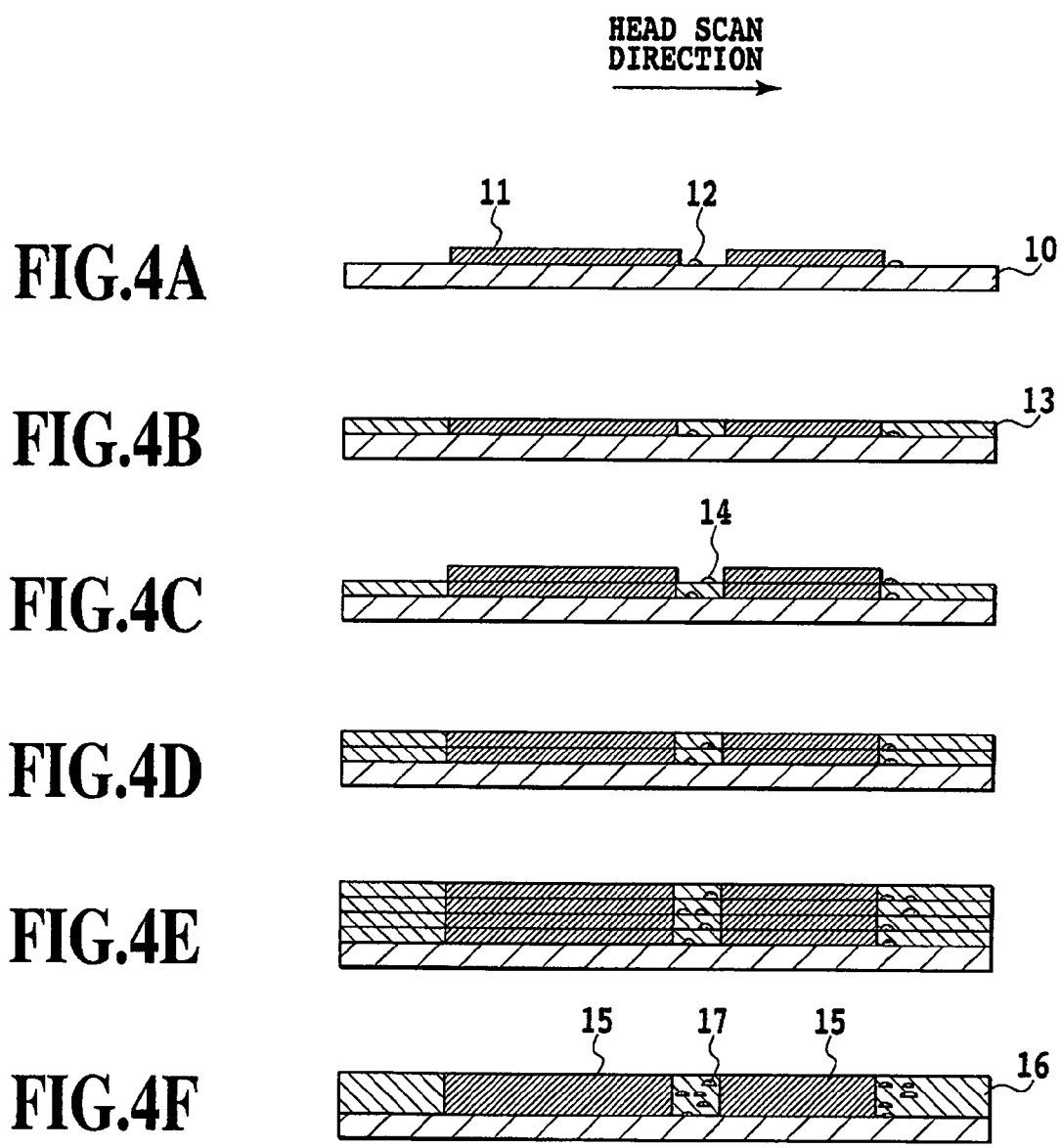
FIGS. 4A to 4F are schematic diagrams showing a process of drawing conductive and insulating patterns on a substrate in the first embodiment of this invention.

Next, a first embodiment of the circuit pattern forming method according to this invention will be explained, by referring to FIG. 3 and FIGS. 4A-4F. FIG. 3 is a flow chart showing a pattern forming process in the first embodiment. FIGS. 4A-4F are schematic diagrams showing a process of drawing conductive and insulating patterns, FIGS. 4A-4E representing states in which a drawn pattern is dried and a solvent evaporated, and FIG. 4F representing a state in which the circuit pattern, after being sintered, is completed.

In this embodiment, a circuit pattern of one integral layer, as shown in FIG. 4F, is constructed of four divided layers, each of which is formed in a separate pattern drawing process, as shown in FIG. 4E. That is, one pattern drawing operation, which is identical to one scan of the head, forms one divided layer among the four to be formed. Thus, to form all four of the divided layers, equivalent to one integral layer of the circuit pattern, requires four drawing operations.

In step S1 of FIG. 3, the number of pattern drawing operations required to form a pattern of a desired thickness by repetitively applying the pattern forming solution to the same position is determined. The number of pattern drawing operations of repetitively applying the conductive pattern forming solution is equal to the number of pattern drawing operations of repetitively applying the insulating pattern forming solution.

In step S2, the liquid ejection head scans once over the entire conductive pattern forming area on the substrate, while ejecting the conductive pattern forming solution onto the substrate 10, to form a conductive pattern 11, which is then dried, as shown in FIG. 4A. Since the pattern drawing operation is executed as the head is scanned toward the right in FIG. 4A, a satellite 12 lands to the right side of the conductive pattern 11.

Next, in step S3, the insulating pattern forming solution is ejected to where the conductive pattern 11 is not drawn, to form an insulating pattern 13, which is then dried. The insulating pattern 13 drawn in this manner covers the satellite 12 of the conductive pattern forming solution that has previously landed. During the insulating pattern drawing operation, a satellite of the insulating pattern forming solution lands, as with the conductive pattern drawing operation. This satellite, however, does not cause any problem in the circuit operation and is, therefore, not shown.

Next, in step S4, a check is made to see if the number of pattern drawing operations has reached a predetermined number. If the predetermined number is not yet reached, the process returns to step S2 and the processing of step S2 and step S3 is repeated. At the current stage, since only the first of the four drawing operations is finished, the processing of the subsequent operations will be explained.

After returning to step S2, the conductive pattern is drawn a second time and dried. This state is shown in FIG. 4C. The second conductive pattern is drawn over the first conductive pattern 11, and a satellite 14, formed during the second operation, lands, not on the satellite 12 that was formed during the first operation, but on the insulating pattern 13 drawn at step S3. Then, as shown in FIG. 4D, step S3 is again executed to draw and to dry the second insulating pattern, as with the first insulating pattern.

Then, as shown in FIG. 4E, when the number of drawing operations in step S2 and step S3 has reached a predetermined total number of four, step S4 checks if all of the patterns are completely drawn. If so, the pattern drawing process is ended.

As a final step, the printed substrate is baked in a separate baking device to cause fine metal particles used as the conductive fine particles in the conductive pattern forming solution to make solid metal connections. As a result, a printed circuit board is formed, as shown in FIG. 4F. In the insulating pattern 16, conductive satellites 17 are present. However, since the drawing of the conductive pattern and the drawing of the insulating pattern are alternated, the conductive satellites are covered with the insulating pattern forming solution. Therefore, the satellites are kept out of touch with one another, thus, forming a good circuit pattern, which prevents the conductive patterns 15 from undesirably getting short-circuited.

It is desired that the conductive pattern 15 and the insulating pattern 16 on the completed printed circuit board be flat. To this end, the pattern forming solution must be chosen so that the conductive pattern and the insulating pattern, after being drawn once and burned, have equal thicknesses. In practice, since a priority is given to the conductive pattern having a desired thickness in terms of conductivity and allowable current, a shrinkage factor of the insulating particles used in the insulating pattern forming solution is preferably almost equal to that of the metal particles used to form the conductive pattern.

Second Embodiment

Next, the second embodiment of this invention will be described. The first embodiment has taken up an example case in which the drawing of the insulating pattern and the drawing of the conductive pattern are alternated every scan. In the second embodiment, a case will be described in which the drawing of the conductive pattern is performed continuously in the direction of lamination, to the extent that the satellites do not pose any short-circuit problem.

Figure 5:
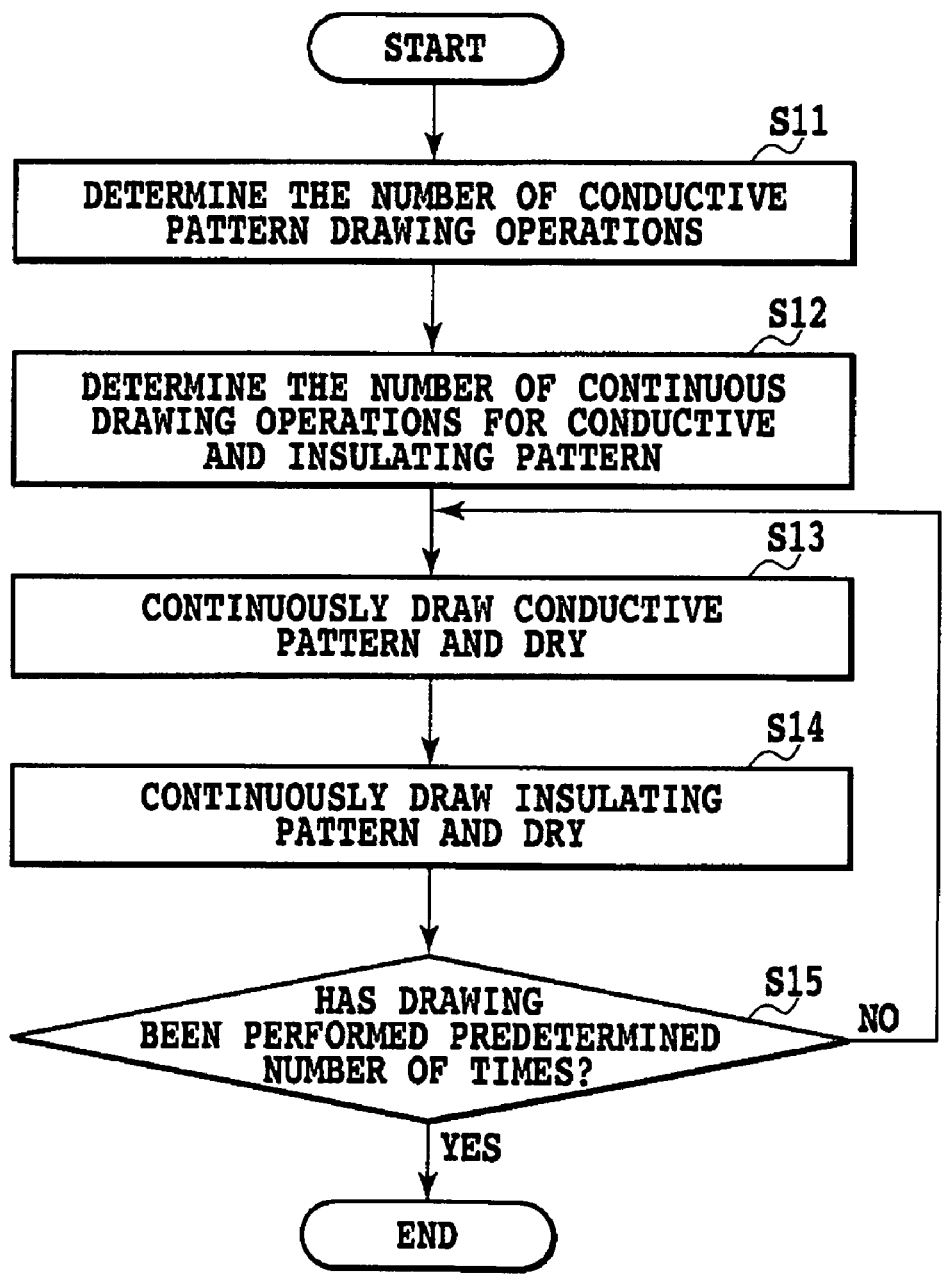
FIG. 5 is a flow chart showing a drawing procedure in the pattern forming method in a second embodiment of this invention.
Figure 6:
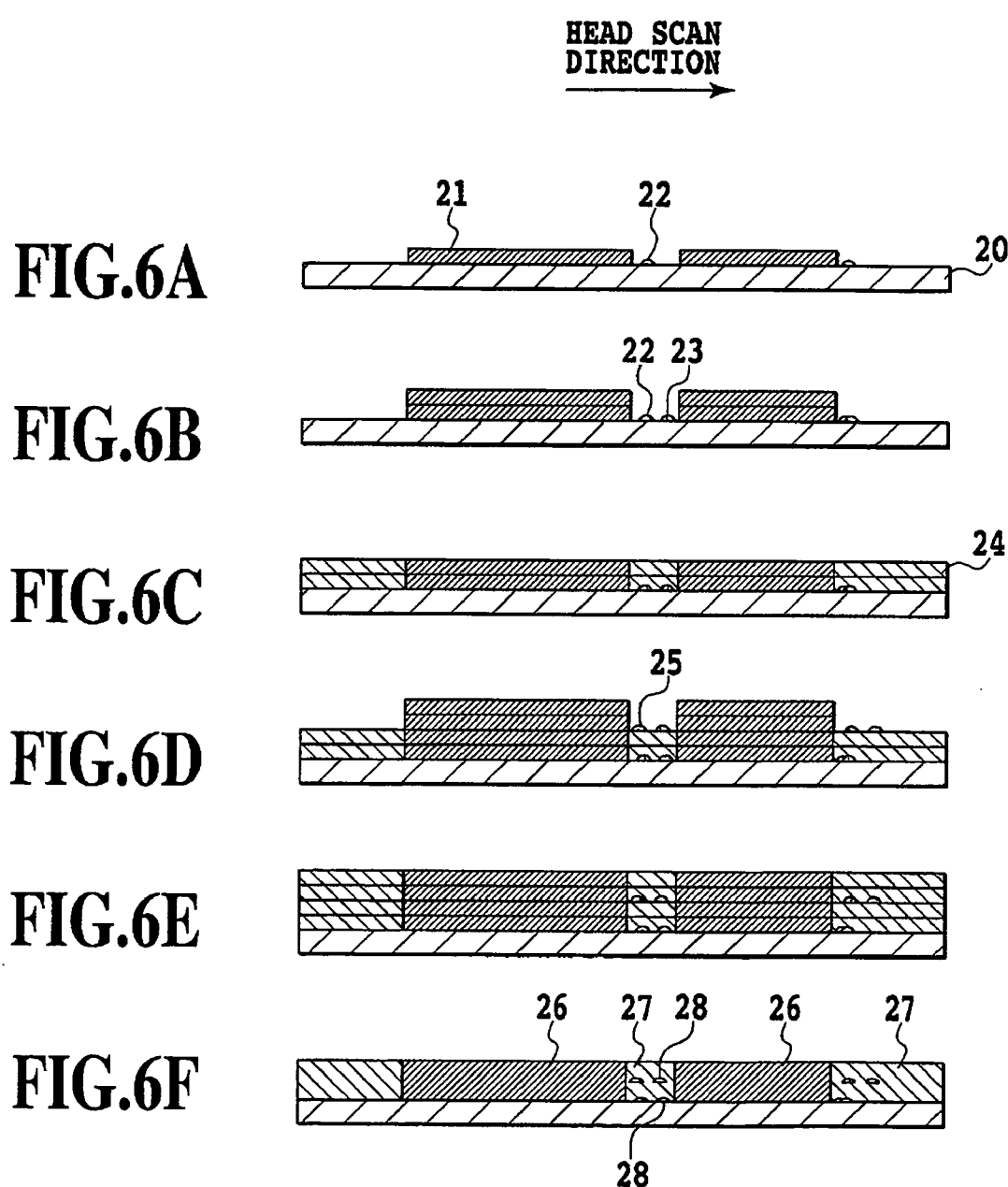
FIGS. 6A to 6F are schematic diagrams showing a process of drawing conductive and insulating patterns on a substrate in the second embodiment of this invention.

FIG. 5 is a flow chart showing a drawing procedure in the circuit pattern forming method of the second embodiment. FIGS. 6A-6F are schematic diagrams showing a process of drawing conductive and insulating patterns on a substrate. FIGS. 6A-6E illustrate a drawn pattern that is dried to evaporate a solvent. FIG. 6F shows a completed circuit pattern after being baked.

Step S11 determines the number of pattern drawing operations required to form a pattern to a desired thickness, the pattern drawing operations involving, respectively, drawing the conductive patterns over the previously drawn one by scanning the head. The desired pattern thickness is set to an appropriate one by considering the conductivity and allowable current. An example case of this embodiment that follows assumes that the conductive pattern of a desired thickness comprises four divided layers, which are drawn by four drawing operations in four head scans.

In step S12, of the number of drawing operations (scan) determined by step S11, the number of pattern drawing operations, which are performed continuously in drawing the conductive pattern and the insulating pattern, is determined. The method of determining the number of drawing operations in a continuous drawing layer for a conductive pattern involves checking beforehand the amount of satellites that is actually produced in one drawing operation of the conductive pattern, and determining the maximum number of drawing operations in the continuous drawing session that does not cause any pattern short-circuit by the satellites produced in these drawing operations getting connected together. The amount of satellites produced changes depending on various conditions as described above, so it is important that the number of drawing operations be determined so as to prevent short-circuits from occurring, even if a somewhat greater amount of satellites than expected is produced. In this embodiment, the following description assumes that the conductive pattern is drawn by performing two drawing operations continuously.

Next, how many of the divided insulating pattern layers is to be drawn continuously or the number of continuous drawing operations is determined. It is desired that the finally formed conductive pattern and insulating pattern are uniform in height. To this end, it is necessary to draw the insulating pattern, so that the thickness of the insulating pattern after being burned is almost equal to the thickness of the conductive pattern that was drawn two times in a row and burned. When, for example, fine insulating particles, with their shrinkage factor almost equal to that of fine metal particles, are used, let us consider a case wherein an amount of insulating particles contained in one droplet of an insulating pattern forming solution is two times that of the metal particles. In this case, the thickness of the insulating pattern formed by one insulating pattern drawing operation is equal to the thickness of the conductive pattern obtained by performing two drawing operations continuously. Conversely, when the amount of insulating fine particles contained in one droplet is less than the amount of metal fine particles, two or more drawing operations are required. This embodiment uses the conductive and insulating pattern forming solutions, which have almost the same coagulation factors and almost the same amount of particles contained in one droplet. It is assumed that two insulating pattern drawing operations are performed continuously, the same number as that of conductive pattern drawing operations performed in a row. This invention, however, is not limited to these conditions.

In step S13, the conductive pattern is drawn the number of times that was determined in step S12. FIG. 6A shows a first divided layer (formed by the first drawing operation) of the conductive pattern that is to be completed by two successive drawing operations. A conductive pattern 21 is drawn on a substrate 20. Since the scan direction of the head is toward the right, a satellite 22 lands on the right side of the conductive pattern 21.

Next, the second divided layer (formed by the second drawing operation), which is drawn and dried, is shown in FIG. 6B. A second conductive pattern is formed over the first conductive pattern 21. A satellite 23 formed during the second drawing operation lands on the substrate 20, but often does not overlap the satellite 22 that has landed during the first drawing operation.

Next, in step S14, at locations where the conductive pattern 21 is not drawn, two divided lasers of the insulating pattern are similarly drawn by two successive drawing operations. FIG. 6C shows two divided layers of insulating pattern drawn in two drawing operations and dried. The satellites 22, 23 that have landed in previous operations are now completely covered with the insulating pattern 24.

Next, in step S15, a check is made to see if the pattern drawing operation has been executed a predetermined number of times. If that number is not yet reached, the process returns to step S13 to repeat the processing of step S13 and step S14. At the current stage, only two of the four conductive pattern drawing operations have been performed, so the subsequent processing will be explained below.

Returning from step S15 to step S13, the third and fourth divided layers (formed by the third and fourth drawing operations), of the conductive pattern, are drawn in two successive drawing operations and dried. This is shown in FIG. 6D. These layers are formed over the already drawn conductive pattern 21. Satellites 25, formed in these drawing operations, land on the insulating pattern 24 drawn in step S14. Then, as shown in FIG. 6E, the insulating pattern is drawn in two successive operations and dried in the same way as described above.

Then, when the number of conductive pattern drawing operations reaches a predetermined number (a total of four drawing operations), step S15 decides that all pattern drawing operations are finished, and ends the pattern drawing process.

As a final step, the substrate drawn with circuit patterns is baked to form a printed circuit board, as shown in FIG. 6F. As shown in this figure, in the insulating pattern 27, to the right of the conductive pattern 26, a plurality of satellites 28, formed during the two successive drawing operations, are situated close to each other at two locations. However, they are not close enough to short-circuit the conductive patterns 26 and, thus, good circuit patterns can be formed. Further, in this embodiment, since two scans are performed successively and then dried, the printed circuit board can be completed in a shorter time than when the layers are dried after each drawing operation, as in the first embodiment.

Third Embodiment

Figure 7:
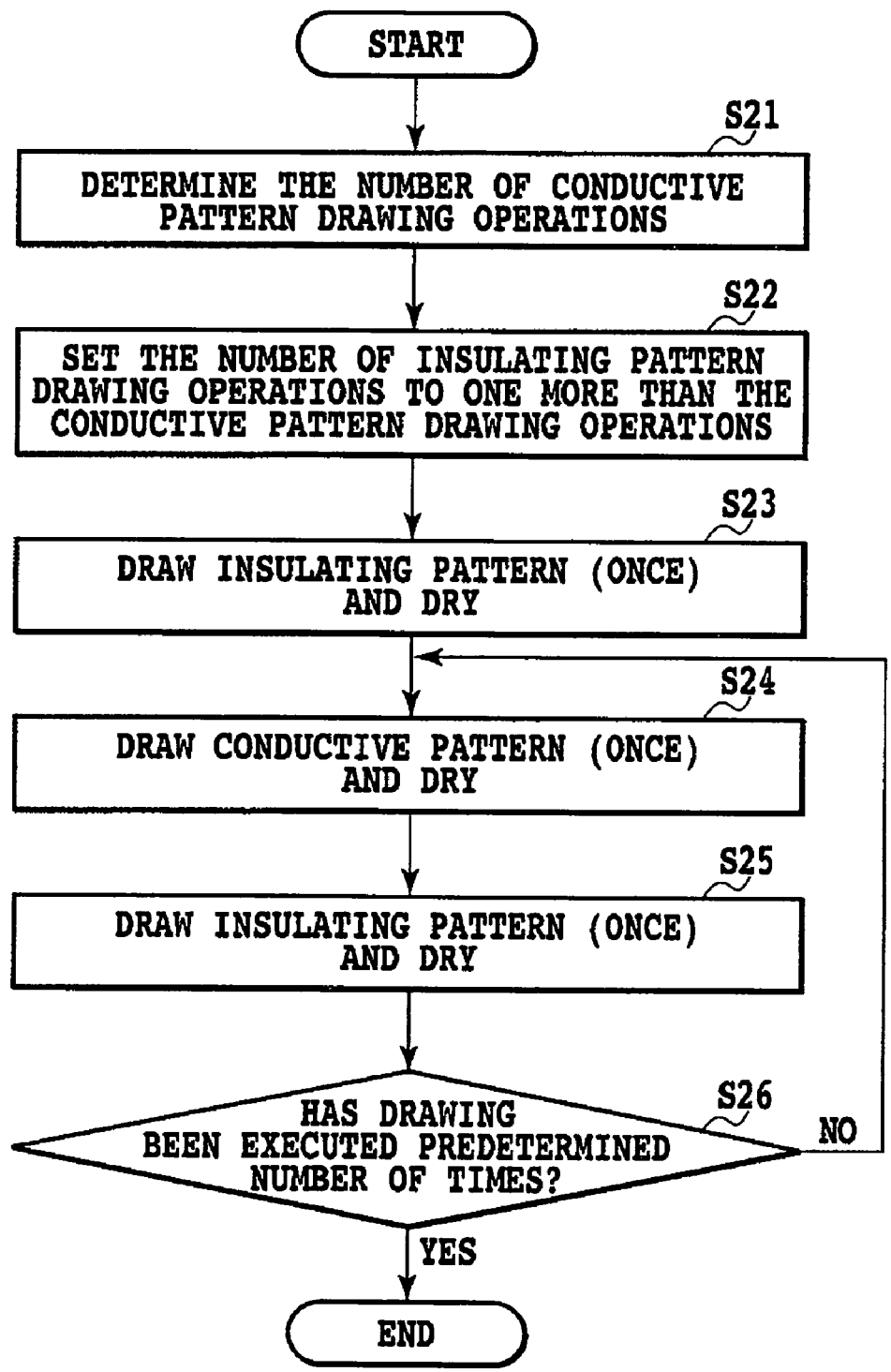
FIG. 7 is a flow chart showing a drawing procedure in the pattern forming method in a third embodiment of this invention.
Figure 10A:
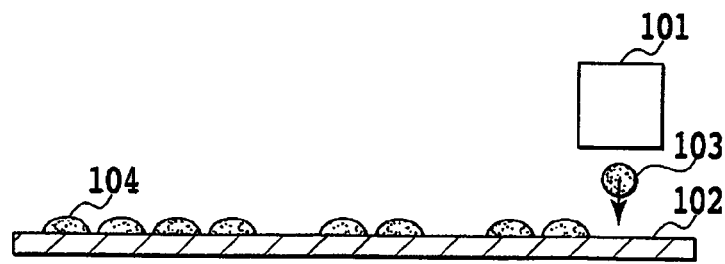
FIGS. 10A to 10K are cross-sectional views showing a process of fabricating a conventional multilayered printed circuit board.
Figure 10B:
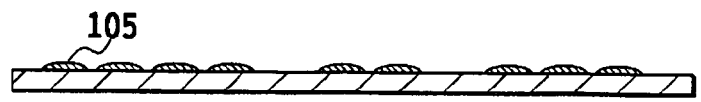
Figure 10C:
Figure 10D:
Figure 10E:
Figure 10F:
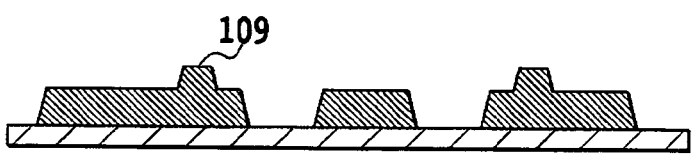
Figure 10G:
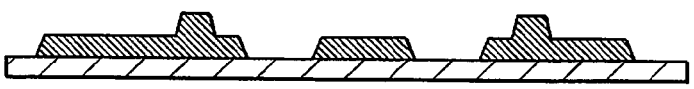
Figure 10H:
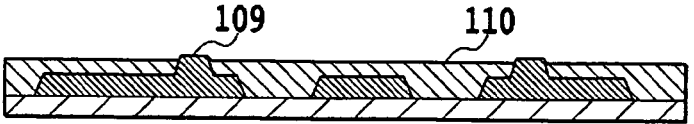
Figure 10I:
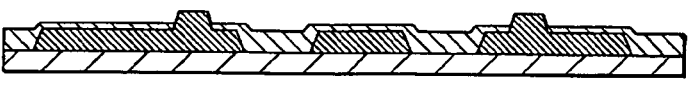
Figure 10J:
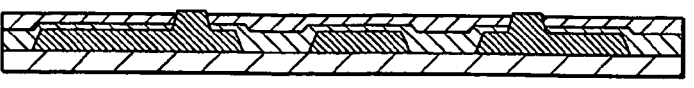
Figure 10K:
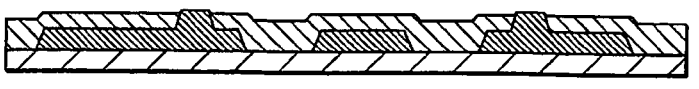
Figure 11A:
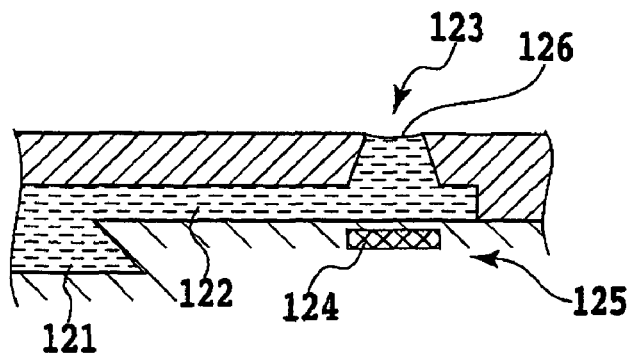
FIGS. 11A to 11F are cross-sectional views showing how a droplet of solution is ejected from the head.
Figure 11B:
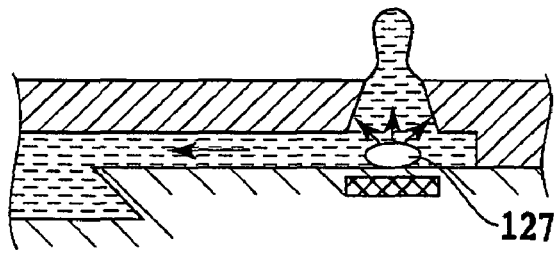
Figure 11C:
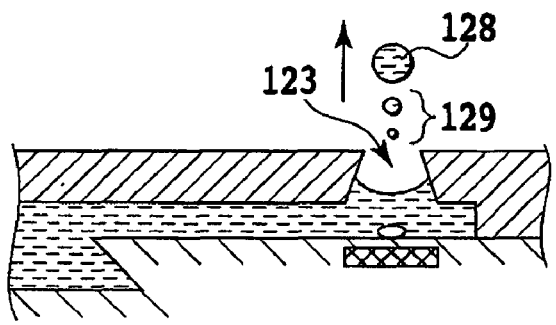
Figure 11D:
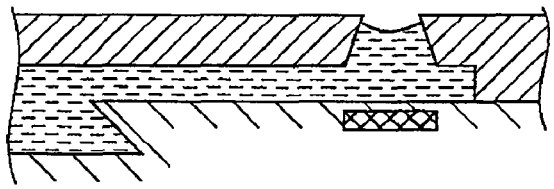
Figure 11E:
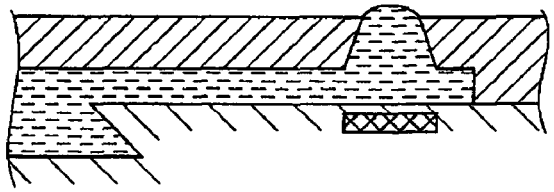
Figure 11F:
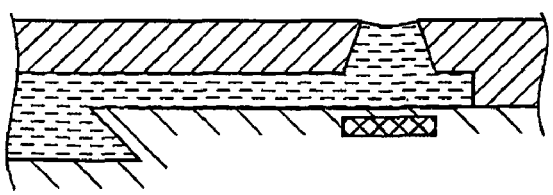
Figure 12A:
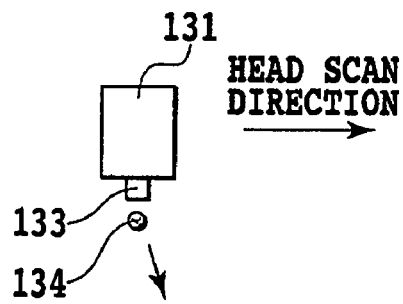
FIGS. 12A to 12C show a positional relation between a main droplet and a satellite.
Figure 12B:
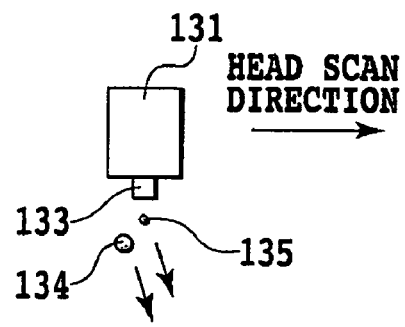
Figure 12C:
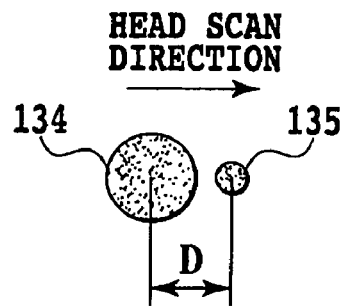
Figure 13A:
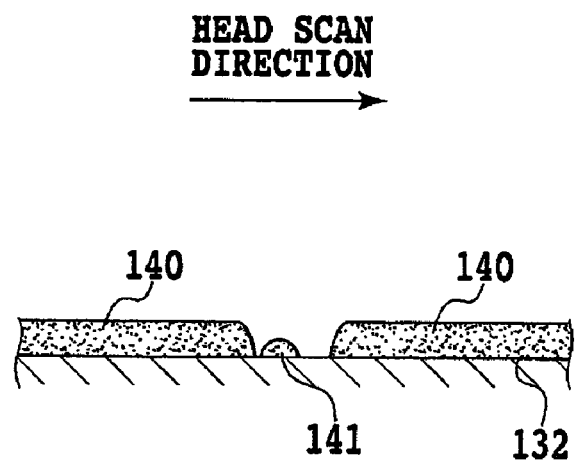
FIGS. 13A to 13C show a circuit made faulty by satellites.
Figure 13B:
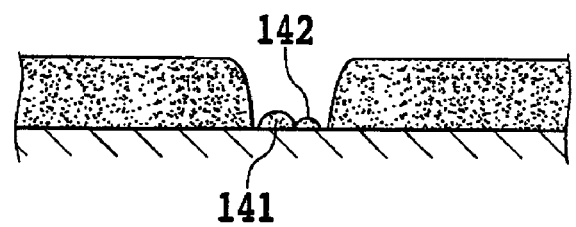
Figure 13C:
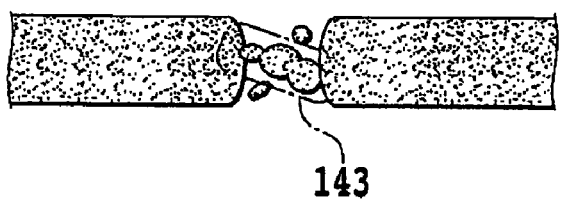

FIG. 7 is a flow chart showing a pattern drawing procedure in the circuit pattern forming method in a third embodiment of this invention. FIGS. 8A-8H are schematic diagrams showing a process of drawing conductive and insulating patterns. FIGS. 8A-8G illustrate a circuit pattern drawn and dried to evaporate a solvent, and FIG. 8H shows a completed circuit pattern after being burned.

This third embodiment not only can be applied to a case wherein one layer of a circuit pattern is formed over an insulating substrate, but also, to a case wherein a circuit pattern is formed over a conductive substrate. Further, this embodiment is also applicable to a case in which another pattern is formed over an already formed circuit pattern, i.e., a so-called multilayered substrate is formed. Here, an example case will be explained in which a second layer of circuit pattern is formed in the multilayered substrate.

As shown in FIGS. 8A to 8G, the circuit pattern P2 of a second layer is formed over circuit pattern P1 of a first layer, made up of a conductive pattern 51 and an insulating pattern 52, both formed on a substrate 50. The circuit pattern P1 of a first layer shown in FIG. 8A to FIG. 8G may be formed in any way, not limited to the method of this invention.

In this embodiment, an example case is described in which, as shown in FIG. 8G, the circuit pattern (P2) of the second layer is formed by dividing it into four layers and drawing them in four drawing operations, and the layer of the insulating pattern is also formed by dividing it into five layers and drawing them in five drawing operations.

In this embodiment, the number of times that a pattern forming solution is repetitively applied to the same position (the number of layers into which the second layer is to be divided), to form circuit pattern P2 of the second layer to a desired thickness, is determined. That is, step S21 determines the number of layers into which the second layer is to be divided (the number of times that the conductive pattern is drawn). Here, the conductive pattern layer is divided into four layers, which are then drawn in four drawing operations to produce a desired thickness of circuit pattern P2. The following step S22 determines the number of layers into which the insulating pattern is to be divided (the number of drawing operations). The number of insulating pattern drawing operations is one more than the number of conductive pattern drawing operations determined by step S21. Therefore, the number of insulating pattern drawing operations in this embodiment is five.

In step S23, as shown in FIG. 8B, one divided layer of an insulating pattern 31 is drawn (one time) over the circuit pattern P1 of a first layer of FIG. 8A and then dried. Next, step S24 draws one divided layer of conductive pattern 32 (one time) and dries it, as shown in FIG. 8C. Since the head scan direction is toward the right, satellites 33 land on the right side of the conductive pattern 32. In the next step, step S25, one divided layer of insulating pattern is again drawn (one time) and dried, as shown in FIG. 8D. With the insulating pattern 34 drawn, the satellites 33 that have landed in the preceding step are covered with the insulating pattern 34.

Next, step S26 checks if the number of pattern drawing operations has reached a predetermined number. If the predetermined number is not yet reached, the process returns to step S24 to repeat the processing of step S24 and step S25. At the current stage, since only one of the four conductive pattern drawing operations is finished, the process repeats step S24 to step S25.

FIG. 8E shows a second divided layer of conductive pattern drawn and dried in step S24, again. Satellites 35, produced during this conductive pattern drawing operation, land on the previously drawn insulating pattern 34, and not on the satellites 33 that landed during the first drawing operation. Then, in step S25, again, an insulating pattern is drawn and dried, as shown in FIG. 8F.

After this, the above step S24 and step S25 are similarly repeated. Then, as shown in FIG. 8G, when the number of times that the conductive pattern has been drawn reaches four, and the number of times that the divided insulating pattern has been drawn reaches five, step S26 decides that all pattern drawing operations are completed, terminating the drawing process.

As a final step, the substrate with drawn circuit patterns is baked in a baking device, to form a printed circuit board, as shown in FIG. 8H. The conductive satellites 38 are present in the insulating pattern 37. In the pattern of the second layer formed in this embodiment, the insulating pattern is drawn prior to the drawing of the conductive pattern, and the drawing of the insulating pattern is alternated with the drawing of the conductive pattern. Therefore, the satellites 38 that land during each conductive pattern drawing operation do not contact each other, preventing the conductive pattern 51 in the first layer and the conductive pattern 36 in the second layer from getting short-circuited undesirably. This makes it possible to form a good circuit pattern.

It is preferred that the conductive pattern 36 and the insulating pattern 37 on the completed print circuit board be flat on the same plane, with no height difference. To meet this requirement, it is necessary in this embodiment to select pattern forming solutions in such a manner that a conductive pattern and an insulating pattern, when formed and baked, have the same thicknesses, with the conductive pattern being formed by dividing it into four layers, and drawing them in four drawing operations, and with the insulating pattern being formed by dividing it into five layers and drawing them in five drawing operations. In practice, since priority is given to the conductive pattern being set to a desired thickness in terms of conductivity and allowable current, it is preferable to select an insulating pattern forming solution according to the thickness of the conductive pattern. That is, it is preferred that the insulating particles used in the insulating pattern forming solution have a shrinkage factor almost equal to that of metal particles used in the conductive pattern forming solution, and that the amount of insulating particles contained in one droplet be set to be about 20% less than that of the metal particles.

Fourth Embodiment

In the first embodiment described above, divided layers of a circuit pattern have been described to be formed by drawing a conductive pattern of one scan followed by the drawing of an insulating pattern of one scan. In this embodiment, as shown in FIG. 1, a conductive pattern and an insulating pattern are formed in the same scan by taking advantage of the configuration of the device in which a conductive head and an insulation head are arranged side by side. Descriptions of those portions similar to the above embodiments are omitted.

FIGS. 9A-9K are schematic views showing a process of drawing conductive and insulating patterns on a substrate 60. FIGS. 9A-9J show a pattern drawn and dried to evaporate a solvent, and FIG. 9K shows a completed circuit pattern after baking.

In the fourth embodiment, a circuit pattern similar to that of the first embodiment is formed.

One complete layer of a circuit pattern in its final form shown in FIG. 9K is, in the drawing process, divided into four layers, which are formed individually, as shown in FIG. 9J. That is, each of the four layers making up the circuit pattern is formed by one scan of the head or one drawing operation. Thus, to form all of the four layers that combine to form one complete layer of the circuit pattern requires four drawing operations.

First, as shown in FIG. 9A, a first scan forms an insulating pattern 61, corresponding to the first divided layer of the circuit pattern, by ejecting droplets 2*d* of an insulating solution from the insulation head. Then, as shown in FIG. 9B, as the conduction head 3 scans over a conductive pattern forming area on the substrate 60, the head 3 ejects droplets 3*d* of a conductive solution to form a conductive pattern 62 on the substrate 60. Because the head draws the conductive pattern as it scans toward the right in the figure, satellites 3*s* of the conductive liquid land on the right side of the conductive pattern 62. When an insulating pattern is drawn, satellites of the insulating solution also land, as in the case with the conductive pattern drawing operation. However, because these satellite do not pose any problem in the circuit operation, they are not shown in the figure.

Then, as shown in FIG. 9C, when the insulation head 2 scans over the insulating pattern forming area on the substrate, the head 2 ejects droplets 2*d* of the insulating solution to form an insulating pattern 63 on the substrate. By drawing the insulating pattern 63 as described above, the satellites 3*s* of the conductive solution that have landed during the previous drawing operation are covered with the insulating pattern 63. Similarly, as shown in FIGS. 9D, 9E and 9F, a conductive pattern 64 and an insulating pattern 65 are formed. An operation up to this step is performed by one scan of the head, and this operation forms one of the four divided layers that combine to form a complete layer of the circuit pattern.

A fixing process based on drawing may be performed by warming the substrate 60 at any desired time or every scan.

Next, in a process shown in FIGS. 9G, 9H and 91, a second scan of the head forms a second divided layer of the four divided layers making up the one complete layer of the circuit pattern. In this operation, too, the conductive satellites 3*s* are covered with insulating patterns 68, 70.

As shown in FIG. 9J, when the number of times that the head performs the drawing operation reaches a predetermined number of four, it is decided that all patterns have been completely drawn, terminating the pattern drawing operation.

Then, as shown in FIG. 9K, the substrate formed with circuit patterns is baked in a separate baking device, causing metal particles contained as conductive particles in the conductive pattern forming solution to form metal connections. Now, the fabrication of circuit patterns is complete.

In all of the above embodiment, although the drawing operation has been described to be performed in only one of the forward and backward scans of the head, this invention can also be applied to a configuration in which the drawing operation is performed in both directions.

The present invention has been described in detail with respect to preferred embodiments, and it will now be apparent from the foregoing to those skilled in the art that changes and modifications may be made without departing from the invention in its broader aspect, and it is the intention, therefore, in the appended claims, to cover all such changes.

What is claimed is:

1. A method of forming a circuit pattern on a substrate, the method comprising steps of:
    checking an amount of satellites generated with a main droplet when the main droplet is ejected from a first head that ejects a conductive liquid;
    determining a maximum number of times of scanning that the first head can continuously scan based on a number of times of scanning that a short-circuit caused by connecting the satellites to each other does not occur;

performing, for at most the determined maximum number of times of scanning, a step of forming a conductive pattern of at least one scan while scanning the first head and a substrate relative to each other, the first head ejecting onto the substrate droplets of a first solution for forming the conductive pattern; and performing, for a plurality of times, a step of forming an insulating pattern of at least one scan while scanning a second head and the substrate relative to each other, the second head ejecting onto the substrate droplets of a second solution for forming the insulating pattern.

2. A circuit pattern forming method according to claim 1, wherein, when forming a conductive pattern and an insulating pattern that adjoin each other on the substrate, the conductive pattern forming step and the insulating pattern forming step are executed in the same scan, and the scan is repeated a plurality of times until the circuit pattern has a predetermined thickness.

3. A circuit pattern forming method according to claim 1, further including a step of fixing in the substrate the solutions applied to the substrate for each scan.

* * * * *